United States Patent [19]

Goulette et al.

[11] 4,453,588

[45] Jun. 12, 1984

[54] COMBINATION MOLD AND SELECTOR DEVICE FOR CASTING SINGLE CRYSTAL OBJECTS

[75] Inventors: Michael J. Goulette, Mickleover; Frederick J. Horrocks, Spondon, both of England

[73] Assignee: Rolls Royce Limited, London, England

[21] Appl. No.: 379,612

[22] Filed: May 18, 1982

[30] Foreign Application Priority Data

Jun. 11, 1981 [GB] United Kingdom ............... 8117924

[51] Int. Cl.$^3$ .............................. B22C 9/04; B22C 9/22
[52] U.S. Cl. ................................... 164/352; 164/122.2; 164/361; 422/248
[58] Field of Search ...................... 422/245, 246, 248; 156/608, 624, DIG. 88; 164/34, 35, 122.2, 246, 216, 352, 361

[56] References Cited

U.S. PATENT DOCUMENTS

| | | | |
|---|---|---|---|
| 1,976,009 | 10/1934 | DeBats .................................. | 164/35 |
| 2,698,467 | 1/1955 | Tarquinee et al. ......... | 156/DIG. 88 |
| 3,177,537 | 4/1965 | Horton ................................ | 164/246 |
| 3,690,368 | 9/1972 | Copley et al. ................... | 164/122.2 |
| 4,111,252 | 9/1978 | Day et al. ......................... | 164/122.2 |
| 4,133,368 | 1/1979 | Hayes .............................. | 164/122.2 |

FOREIGN PATENT DOCUMENTS

| | | | |
|---|---|---|---|
| 2717886 | 11/1977 | Fed. Rep. of Germany ........ | 164/34 |
| 37606 | 12/1975 | Japan ................................... | 164/34 |
| 1270395 | 4/1972 | United Kingdom . | |
| 1369270 | 10/1974 | United Kingdom . | |
| 2030069 | 4/1980 | United Kingdom . | |
| 2100633 | 1/1983 | United Kingdom ............. | 164/122.2 |

Primary Examiner—David L. Lacey
Attorney, Agent, or Firm—Cushman, Darby & Cushman

[57] ABSTRACT

A selector for use in allowing only one crystal from a directionally-solidified initiating mould cavity to grow into a main casting cavity is described. The selector comprises a ceramic member with a curvilinear groove formed in its surface. The selector is positioned in a two part ceramic shell mould which cooperates with the groove in the selector to form a curvilinear passage which selects the single crystal required.

6 Claims, 6 Drawing Figures

COMBINATION MOLD AND SELECTOR DEVICE FOR CASTING SINGLE CRYSTAL OBJECTS

BACKGROUND OF THE INVENTION

This invention relates to a selector device for use in the casting of single crystal objects.

In recent years casting single crystal objects has become a practical proposition, and the potential advantages of such objects in difficult environments such as the turbine region of gas turbine engines have lead to considerable effort being put into the development of the casting process.

The technique most usually adopted to produce a single crystal casting involves the use of a chill, a mould having initiating and main cavities, a selector device and a directional solidification furnace. The casting process then involves pouring a charge of molten metal to fill the whole of the mould including both cavities and the selector device, and causing the metal to solidify in such a way that the solidification front travels uniformly from the chill and through the initiating cavity, the selector and the main cavity in order.

The directional solidification of the metal from the chill and into the initiating cavity gives rise initially to a columnar grain structure in which the grains of the solidified metal extend unidirectionally away from the chill and toward the selector. When the solidification front reaches the selector, which comprises a relatively narrow passage of curvilinear or helical shape, not all of the columnar grains can continue to grow, and the selector passage is chosen so that only one grain or crystal succeeds in growing through the passage and into the main cavity.

On debouching (emptying) into the main cavity, the single crystal alone will continue to grow as long as the transition from the selector passage into the main cavity is sufficiently smooth and as long as no other grain initiating irregularities are present. The metal in the main cavity, which is arranged to have the form of the required cast object, is thus caused to solidify as a single crystal of the desired form.

One problem with the apparatus used for this casting process has arisen because of the narrow, curvilinear shape required for the selector passage. The conventional way of providing this passage has been to produce a wax duplicate of the required passage, and to form a shell round this wax duplicate in the normal manner used for lost-wax castings. The shell can then be attached to the initiating and main cavities, or alternatively the wax can be attached to the wax patterns which form the initiating and main cavities and the vanes can be shelled as an integral whole.

Although this technique produces quite satisfactory internal cavities and selector passage, that part of the wax pattern which will eventually define the passage is inevitably narrow and relatively weak and this weakness is compounded by the convoluted form of the passage. Consequently this part of the pattern is prone to damage, in the shelling process and in any handling. It will also be noted that producing the duplicate of the passage is not easy, since this cannot be carried out using a simple two-part die.

Attempts have been made to solve these problems, using reinforcing means for the selector passage shell or support means for the rest of the shell mould. However, these have tended to be complex, increasing the cost of what is already a relatively expensive process.

The present invention provides a selector of simple form which is relatively strong.

SUMMARY OF THE INVENTION

According to the present invention, a selector device for use in single crystal casting comprises a ceramic member having a curvilinear groove formed in its surface, the curvilinear groove opening smoothly out at one extremity of the selector and co-operating with a transition piece, formed at said extremity of the selector, to provide a smooth increase in the cross-sectional area of said passage.

The ceramic member may be solid and cylindrical, in which case the groove is preferably of helical form extending on its outer surface between the extremities of the ceramic member.

In another aspect the invention comprises a mould for single crystal casting incorporating a selector which comprises a ceramic member having a curvilinear groove formed in its surface. The mould then preferably has a portion which overlaps the groove to form, in conjunction with the groove, a curvilinear selector passage. Again, the ceramic member may be substantially cylindrical.

The mould preferably defines an initiating cavity and a main cavity interconnected by said curvilinear passage, the initiating cavity being constructed and arranged to be placed in thermal contact with a chill.

The invention also includes a method of making a single-crystal casting using the selector and/or mould as set out above.

BRIEF DESCRIPTION OF THE DRAWINGS

The invention will now be particularly described, merely by way of example, with reference to the accompanying drawings in which.

DESCRIPTION OF THE PREFERRED EMBODIMENTS

Figure 1:
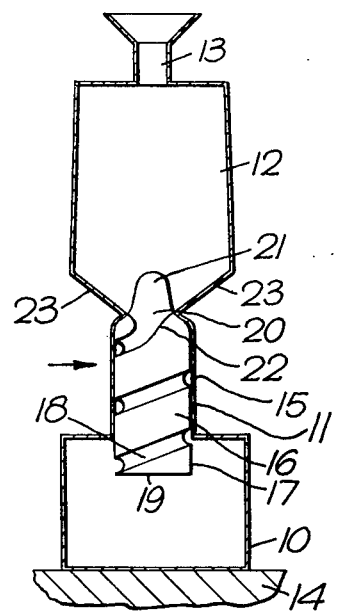
FIG. 1 is a partly broken-away view of a mould and selector in accordance with the invention.

In FIG. 1 there is shown a shell mould consisting of an initiating cavity 10, a selector portion 11 and a main cavity 12. The main cavity 12 has a sprue passage 13 for the entry of molten metal, while the initiating cavity 10 has its bottom face open and sits upon a chill shown at 14.

The selector portion 11 comprises a hollow shell having a substantially cylindrical inner surface 15 within which a ceramic selector device 16 fits closely. The selector device 16 consists of a ceramic member having a substantially cylindrical outer surface 17 in which is formed a helical groove 18. The groove 18 extends from the lowermost extremity 19 of the selector device 16 to the uppermost extremity 20. At the extremity 20 the selector device 16 is provided with an integral transition piece 21 in the form of a rounded projection from the top of the selector.

It will be seen that the lower portion of the selector device 16 extends into the initiating cavity 10, and that where the selector is engaged within the selector portion 11 of the shell mould the helical groove 18 is overlaid by the wall of the selector portion 11 to form a helical passage extending from the initiating cavity 10 to the main cavity 12. At its upper extremity the passage formed between the groove 18 and the wall of the shell selector portion 11 increases smoothly in cross sectional area by virtue of a widening of the groove itself at 22 followed by the debouching of the passage into the main cavity 12. At this point the main cavity 12 has a tapered section formed by sloping walls 23, and in conjunction with the rounded transition piece 21 the transverse area of the mould is caused to increase smoothly from that of the passage to the full cross section of the main cavity 12. The rounded form of the transition piece 21 and the positioning of the walls 23 of the mould, which in effect form extensions of the widened portion 22 of the helical passage, enables a smooth surface to be provided in this region without any grain-initiating discontinuities.

Figure 2:
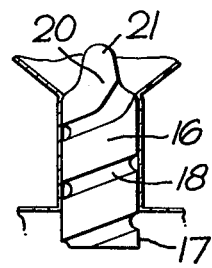
FIG. 2 is a view of the selector of FIG. 1, taken on the arrow 2, and FIGS. 3–6 inclusive illustrate, steps in the method of manufacture and use of the mold and selector of FIGS. 1 and 2.

FIG. 2 illustrates the selector device 16 viewed from the side in relation to the FIG. 1 view. Here the shape of this transition piece 21 can be better appreciated, it will be seen that it comprises a rounded or closed projection with one side flattened to form the end portion of the groove 18 as it debouches into the main cavity 12.

There are some features of the mould and selector combination of FIG. 1 which should be noted. Thus the sectional area of the mould selector portion 11 with the selector device 16 inside it is relatively large, certainly as compared with the cross section of the helical passage. This means that this part of the mould may be relatively strong, and it will be appreciated that this strength is largely obtained because in our invention the selector passage is formed from a groove in the outer surface of a ceramic member which can be made to have the desired strength. Again, although not essential the substantially cylindrical form of the selector surface allows the use of a helical passage whose form is smoothly curving and which is particularly suitable as a selector device.

Figure 3:
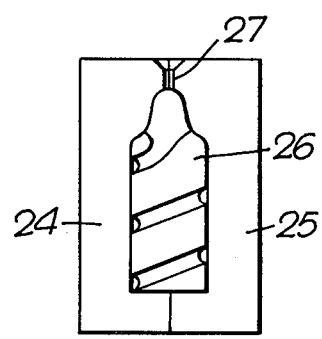

FIGS. 3-6 illustrate how the mould and selector of FIGS. 1 and 2 is made and used. In FIG. 3 are shown the die halves 24 and 25 of an injection moulding machine, the two halves defining a cavity 26 whose shape is that of the selector. It will be seen that the cylindrical overall shape and helical groove of the desired selector enable the use of a two-part die. A sprue passage 27 allows ceramic material to be injected in fluid form to fill the cavity 26, and in the manner of the ceramic cores used to provide cavities in castings the fluid ceramic is arranged to harden due to drying, or the application of heat affecting a thermo-setting resin which is a constituent of the ceramic mix. The hardened ceramic selector may then be removed from the die, dressed as necessary, and fired to produce the final article.

Figure 4:
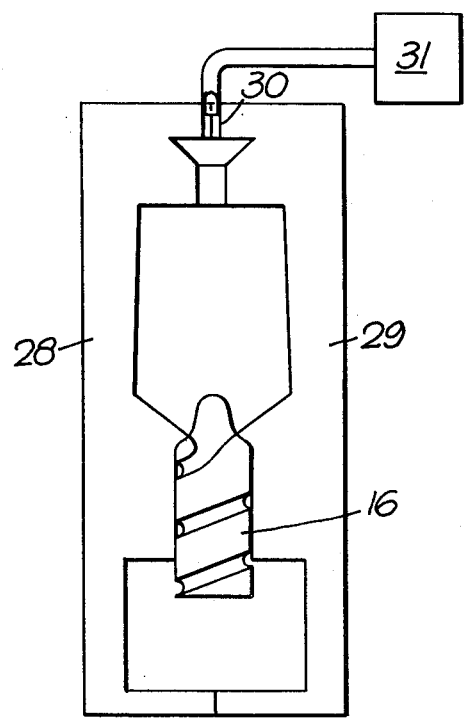
Figure 5:
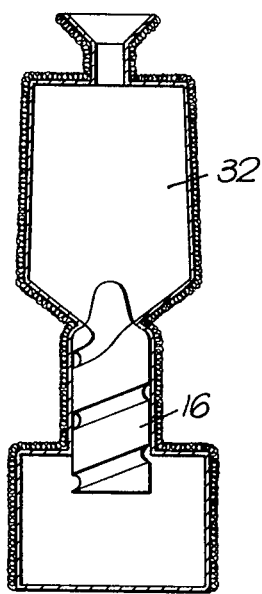
Figure 6:
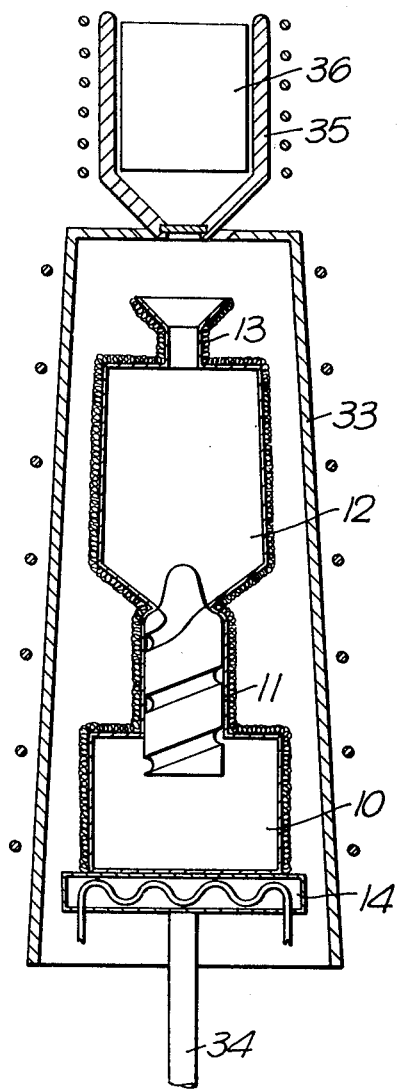

The selector device 16 thus produced is then placed in the split die of a further injection machine. This step is illustrated in FIG. 4, and it will be seen that the die halves 28 and 29 define between them a cavity whose shape is that of the two cavities and the selector portion of the mould of FIG. 2. The selector device 16 is held in the die in the part which will define the selector portion 11 and in what will be its final positioning. A sprue passage 30 is again provided, and molten wax can be injected from an injector device 31 to fill the die cavity, including the helical groove 18 in the selector device 16.

It will be noted that in this instance the wax pattern for the two cavities 10 and 12 and the selector portion 11 are made in one piece. We believe that it is desirable to form at least the wax pattern for the selector portion 11 and the main cavity 12 in one piece to ensure a good transition of the selected crystal into the main cavity. It is not essential to form the pattern for the initiation cavity 10 integral with the selector, and if desired this pattern may be made separately and attached by wax welding or the like to the pattern for the selector. Any undesirable grains nucleated at a less than perfect joint in this position are then selected out in the spiral.

The molten wax is allowed to cool, and thus to set, and the die halves are split to allow the wax pattern 32 thus formed to be removed together with the selector device 16 embedded therein. The wax pattern 32 is then dressed if necessary, and is then shelled in a conventional manner to form a casting of ceramic material thereon. The shelling process involves dipping the pattern in a ceramic slurry and stuccoing the dipped pattern with granular ceramic material, this process being repeated until a desired thickness of coating is built up. It may be necessary to perform some specific operation to ensure that the cylindrical surface of the selector device 16 adheres to the shell material; for instance it may be necessary to roughen this surface of the selector and/or to remove any wax coating from it.

The shelled pattern may then be fired to strengthen it and to melt out the wax pattern from the shell. A strong shell is thus formed, and at this stage the base of the initiating cavity 10 may be removed to leave it open so that it can be fitted to a chill. Once this step has been carried out the mould plus selector is in the condition as described with reference to FIG. 1.

The mould is then assembled to a water-cooled chill 14 and is located within a furnace 33. The chill is mounted on a raising or lowering device 34 so that the mould can be withdrawn from the furnace, and the whole is enclosed in a vacuum chamber (not shown). The device 34 may be electro-mechanical, or hydraulic or pneumatic. At the top of the furnace 33 is mounted a bottom-pouring device 35 of known type, which is provided with a charge of metal at 36.

In operation, the vacuum chamber is evacuated and the furnace operated to heat the mould to a predetermined temperature. The induction heater of the bottom-pouring device 35 is actuated to melt the charge 36, which breaks a fusible plug and falls into the space 13 and thus fills the mould.

With the furnace still operative, the device 34 is operated to withdrawn the filled mould slowly downward from the furnace while the water-cooled chill 14 operates to withdraw heat from the bottom of the mould. In this way a solidification front is caused to move evenly up the mould, and the process operates as described above to provide a single-crystal casting in the main mould cavity 12. The completed casting may then be removed from the mould in the conventional manner.

It will be seen that the cylindrical selector with its helical groove on the outer surface represents a very convenient embodiment of the invention. However, it will be appreciated that the selector could be of various other shapes such as polygonal or even completely asymmetrical in cross-section. Again, it is not necessary for the groove to be formed on the outer surface of the selector; it would be possible to make the selector as a hollow body with the groove formed on its inner surface.

We claim:

1. A mould for single crystal casting comprising:

a ceramic shell mould having a main molten metal cavity, an initiating cavity and a selector portion intermediate and communicating with said main cavity and said initiating cavity, and a ceramic selector device having a transition piece extending from one of its extremities into said main cavity and positioned within said selector portion, said selector device having a curvilinear groove formed in its surface, the curvilinear groove opening smoothly out at said one extremity of the selector device and cooperating with said transition piece to provide a smooth increase in the cross-sectional area of said groove.

2. A mould as claimed in claim 1 and in which said shell mould has a portion which overlays said groove to form, in conjunction with the groove, a curvilinear passage extending from the main cavity to the initiating cavity.

3. A mould as claimed in claim 1 and in which said curvilinear groove is formed in the outer surface of said ceramic device.

4. A mould as claimed in claim 3 and in which said ceramic device is of substantially cylindrical shape.

5. A mould as claimed in claim 4 and in which said groove is of helical form.

6. A mould as claimed in claim 1 and in which said initiating cavity has a configuration adapted to be placed in thermal contact with a water-cooled chill.

* * * * *